(12) United States Patent
Wang

(10) Patent No.: US 11,335,754 B2
(45) Date of Patent: May 17, 2022

(54) DISPLAY PANEL AND DISPLAY DEVICE INCLUDING CAMERA AREA WITH LIGHT TRANSMISSION HOLE

(71) Applicant: Wuhan China Star Optoelectronics Semiconductor Display Technology Co., Ltd., Wuhan (CN)

(72) Inventor: Zhenmin Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 162 days.

(21) Appl. No.: 16/769,592

(22) PCT Filed: Mar. 17, 2020

(86) PCT No.: PCT/CN2020/079638
§ 371 (c)(1),
(2) Date: Jun. 4, 2020

(87) PCT Pub. No.: WO2021/114506
PCT Pub. Date: Jun. 17, 2021

(65) Prior Publication Data
US 2021/0408148 A1    Dec. 30, 2021

(30) Foreign Application Priority Data

Dec. 12, 2019 (CN) .......................... 201911274082.8

(51) Int. Cl.
*H01L 27/32* (2006.01)
*H01L 51/52* (2006.01)

(52) U.S. Cl.
CPC ........ *H01L 27/326* (2013.01); *H01L 27/3234* (2013.01); *H01L 27/3246* (2013.01); *H01L 51/5253* (2013.01); *H01L 27/3211* (2013.01); *H01L 27/3213* (2013.01); *H01L 27/3216* (2013.01); *H01L 27/3218* (2013.01); *H01L 2251/301* (2013.01)

(58) Field of Classification Search
CPC .............. H01L 27/326; H01L 27/3234; H01L 27/3246; H01L 27/3211; H01L 27/3213; H01L 27/3216; H01L 27/3218; H01L 51/5253; H01L 2251/301
See application file for complete search history.

(56) References Cited

U.S. PATENT DOCUMENTS

| 10,756,136 B1* | 8/2020 | Ma ........................ H01L 31/147 |
| 11,211,430 B2* | 12/2021 | Han ...................... H01L 51/001 |
| 2019/0251325 A1 | 8/2019 | Park et al. |
| 2019/0326364 A1* | 10/2019 | Chai ................... H01L 27/3216 |

(Continued)

FOREIGN PATENT DOCUMENTS

| CN | 109950288 | 6/2019 |
| CN | 110047852 A * | 7/2019 ......... H01L 27/3218 |

(Continued)

*Primary Examiner* — Ida M Soward

(57) ABSTRACT

A display panel and a display device thereof are provided. Pixel units of camera areas are removed to form a light transmission hole, and after that, the camera component is disposed below the display panel of the camera area. External light can be incident on the camera component directly, so purpose of photographing is achieved, and the screen-to-body ratio is further increased.

18 Claims, 4 Drawing Sheets

(56) References Cited

U.S. PATENT DOCUMENTS

| | | | | |
|---|---|---|---|---|
| 2020/0105843 A1* | 4/2020 | Baek | .................... | H01L 27/3218 |
| 2020/0227488 A1* | 7/2020 | Xin | ..................... | H01L 27/3225 |
| 2020/0403043 A1* | 12/2020 | Xin | ...................... | H01L 27/326 |
| 2021/0013277 A1* | 1/2021 | Liu | ..................... | H01L 27/3218 |
| 2021/0028389 A1* | 1/2021 | Zhang | .................. | H01L 27/326 |
| 2021/0043166 A1* | 2/2021 | Zhao | ........................ | G09G 5/14 |
| 2021/0065625 A1* | 3/2021 | Wang | .................. | G09G 3/2003 |
| 2021/0217821 A1* | 7/2021 | Han | ..................... | H01L 51/0011 |
| 2021/0248945 A1* | 8/2021 | Liu | ......................... | G09G 3/20 |
| 2021/0305282 A1* | 9/2021 | Wang | .................. | H01L 27/1255 |
| 2021/0360152 A1* | 11/2021 | Yuan | ...................... | H04N 5/217 |
| 2021/0408102 A1* | 12/2021 | Chen | ........................ | G09F 9/33 |

FOREIGN PATENT DOCUMENTS

| | | |
|---|---|---|
| CN | 110047897 | 7/2019 |
| CN | 110071160 | 7/2019 |
| CN | 110224077 | 9/2019 |
| JP | 2003-228040 | 8/2003 |

\* cited by examiner

DISPLAY PANEL AND DISPLAY DEVICE INCLUDING CAMERA AREA WITH LIGHT TRANSMISSION HOLE

RELATED APPLICATIONS

This application is a National Phase of PCT Patent Application No. PCT/CN2020/079638 having International filing date of Mar. 17, 2020, which claims the benefit of priority of Chinese Patent Application No. 201911274082.8 filed on Dec. 12, 2019. The contents of the above applications are all incorporated by reference as if fully set forth herein in their entirety.

FIELD AND BACKGROUND OF THE INVENTION

The present disclosure relates to the field of display technology, and specifically relates to a display panel and a display device thereof.

Display devices can transform data from computers into various characters, numerals, symbols, or intuitive images and display them, Input tools, such as keyboards can be used to input commands or data into computers, furthermore, assisted by hardware and software of systems, display contents can be added, deleted, or changed at any time. The display devices can be divided into types of plasma, liquid crystal, light emitting diode, cathode ray tube, etc. according to used display devices.

Organic light emitting diode (OLED) display devices are also known as organic electroluminescence display devices or organic light emitting semiconductors. The working principle of OLEDs is that when the power is supplied to an appropriate voltage, positive holes and cathode charges are combined in a light emitting layer, and under Coulomb force, they are combined to form excitons (electron-hole pairs) in an excited state at a certain probability, and the excited state is unstable in a general environment. The excitons in the excited state recombine and transfer energy to a luminescent material, causing it to jump from the ground state to the excited state, and the energy in excited state generates photons through the radiation relaxation process to release light energy and produce light, and according to the different formula of the luminescent material, it can produce three primary (RGB) colors of red, green and blue to form the basic colors.

OLEDs have advantages such as low voltage demand, high power saving efficiency, rapid response, light weight, thin thickness, simple structure, low cost, wide visual angle, almost infinite contrast, low power consumption and ultimate rapid reaction speed, and have become one of the most important display technologies today.

With development of mobile terminals, people's display requirements on display screens are increasingly higher, and high screen-to-body ratio mobile terminals have become an inevitable trend, so a new display panel is needed to seek to improve the screen-to-body ratio the display panel.

SUMMARY OF THE INVENTION

One purpose of the present disclosure is to provide a display panel and a display device thereof, which can improve a screen-to-body ratio of the display panel.

In order to solve the problems mentioned above, an embodiment of the present disclosure provides a display panel, which includes a display region including a main display area and at least one camera area; a plurality of pixel units distributed on the display panel of the display region, wherein a distribution density of the pixel units on the camera area is less than a distribution density of the pixel units on the main display area; and at least one light transmission hole defined on an area of the camera area without the plurality of pixel units.

Furthermore, the plurality of pixel units on the main display area and the camera area are arranged uniformly.

Furthermore, the distribution density of the pixel units on the camera area is less than or equal to half of the distribution density of the pixel units on the main display area.

Furthermore, the display region includes two, three, or four camera areas, and each of the camera areas has the at least one light transmission hole.

Furthermore, the plurality of pixel units include a substrate, a thin film transistor structure layer, a pixel definition layer, a pixel electrode, a light emitting layer, and a cathode layer.

The thin film transistor structure layer is disposed on the substrate. The pixel definition layer is disposed on the thin film transistor structure layer, and the pixel definition layer has an opening. The pixel electrode is disposed in the opening of the pixel definition layer. The light emitting layer is disposed on the pixel electrode in the opening. The cathode layer is disposed on the light emitting layer.

Furthermore, the at least one light transmission hole penetrates from a surface of the cathode layer away from the substrate to a surface of the substrate away from the cathode layer.

Furthermore, the pixel units include four subpixels, and the subpixel are respectively a red subpixel, a blue subpixel, and two green subpixels.

Furthermore, a shape of the camera area includes one or more of a rectangular shape, a polygonal shape, a circular shape, and an ellipse.

Furthermore, the display panel further includes a first inorganic layer, an organic layer, and a second inorganic layer. The first inorganic layer is disposed on the cathode layer. The organic layer is disposed on the first inorganic layer. The second inorganic layer is disposed on the organic layer.

Another embodiment of the present disclosure further provides a display device, which includes the display panel related to the present disclosure, and further includes a camera component correspondingly disposed below the display panel of the camera area.

The present disclosure relates to a display panel and a display device thereof. In the present disclosure, the pixel units of the camera area are removed to form a light transmission hole, and after that the camera component is disposed below the display panel of the camera area. External light is able to be incident on the camera component directly, purpose of photographing is achieved and the screen-to-body ratio is further increased. Furthermore, in the present disclosure, the camera areas are disposed on corners of the display panel to prevent difference on visual perception incurred by lowering pixels per inch (PPI). By taking pictures with a plurality of camera components together, correcting the picture quality, the photos are optimized. Meanwhile, the configuration of the plurality of camera components is conducive to increasing a photographing range of camera.

BRIEF DESCRIPTION OF THE SEVERAL VIEWS OF THE DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
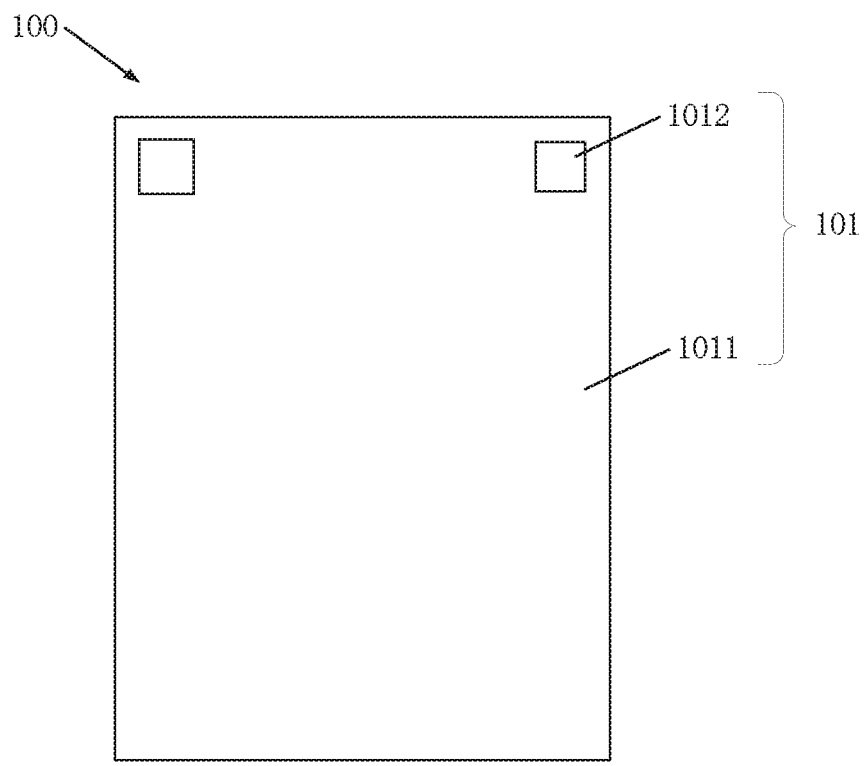
FIG. 1 is a plane schematic diagram of a display panel of a first embodiment of the present disclosure.

The preferred embodiments of the present disclosure are described in detail below with reference to the accompanying figures to completely introduce technical content of the present disclosure to those skilled in the art, and to give an example that the present disclosure can be implemented. This makes the technical content of the present disclosure will be clearer and those skilled in the art will more readily understand how to implement the present disclosure. However, the present disclosure can be implemented in many different forms of embodiments. The scope of the present disclosure is not limited to the embodiments mentioned herein, and the description of the embodiments below is not intended to limit the scope of the present disclosure.

The directional terms of which the present disclosure mentions, for example, "top", "bottom", "upper", "lower", "front", "rear", "left", "right", "inside", "outside", "side", etc., just refer to directions of the accompanying figures. The directional terms used herein are used to explain and describe the present disclosure, and are not intended to limit the scope of the present disclosure.

In the figures, components with similar structures are indicated by the same reference numerals, and components that have similar structure or function are indicated by the similar reference numerals. Moreover, for ease of understanding and description, the dimensions and thickness of each component shown in the accompanying figures are arbitrarily shown, and the present disclosure does not limit the dimensions and thickness of each component.

When a component is described as "on" another component, the component can be placed directly on the other component; there can also be an intermediate component, the component is placed on the intermediate component, and the intermediate component is placed on another component. When a component is described as "mounted" or "connected to" another component, it can be understood as "directly mounted" or "directly connected to", or a component is "mounted" or "connected to" through an intermediate component to another component.

First Embodiment

As illustrated in FIG. 1, a display panel 100 includes a display region 101. The display region 101 includes a main display area 1011 and at least one camera area 1012.

Furthermore, the display panel 100 further includes a plurality of pixel units 1. The plurality of pixel units 1 are distributed on the display panel 100 of the display region 101.

Figure 2:
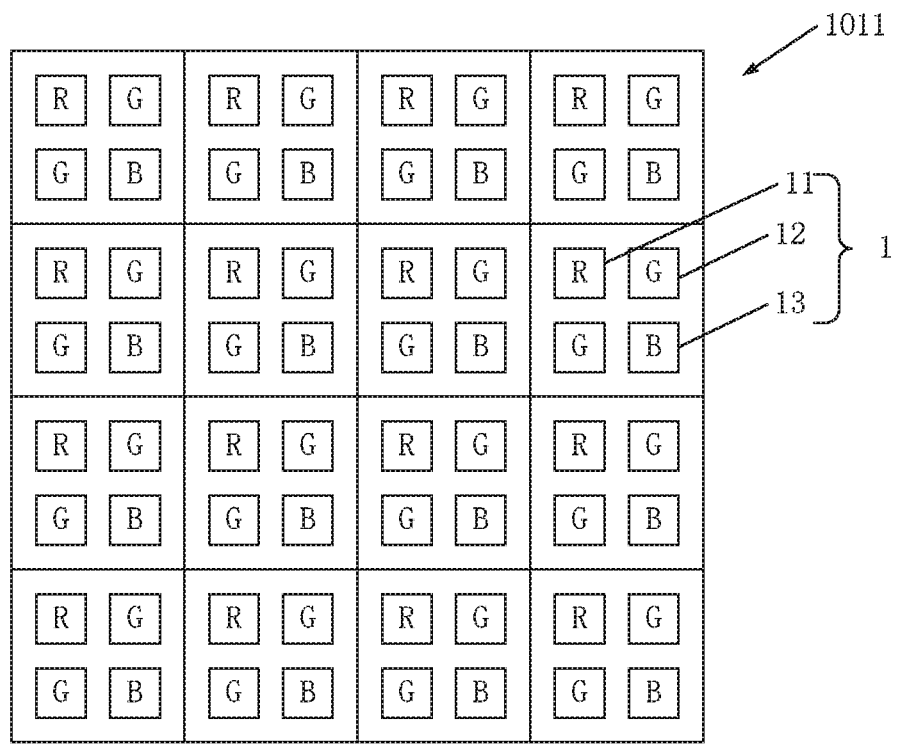
FIG. 2 is a pixel unit distribution schematic diagram of a main display area of the present disclosure.

As illustrated in FIG. 2, the pixel units 1 of the main display area 1011 are connected to each other and are arranged in an array. Furthermore, the pixel units 1 include four subpixels, and the subpixel are respectively a red subpixel 11, a blue subpixel 13, and two green subpixels 12.

Figure 3:
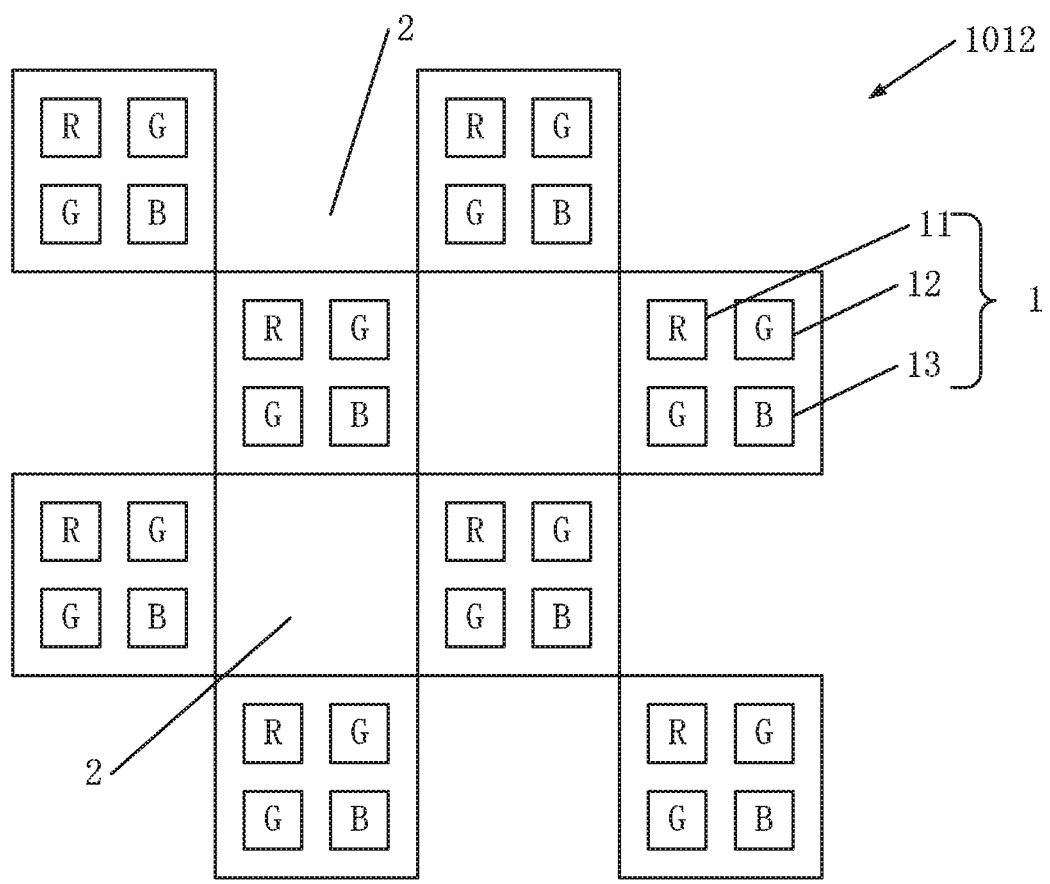
FIG. 3 is a pixel unit distribution schematic diagram of a camera area of the present disclosure.

As illustrated in FIG. 3, the display panel 100 on the camera area 1012 includes the pixel units 1 and further includes at least one light transmission hole 2. The light transmission hole is defined on an area of the camera area 1012 without disposing the pixel units 1. Furthermore, the pixel units 1 include four subpixels, and the subpixel are respectively a red subpixel 11, a blue subpixel 13, and two green subpixels 12. Removing part of the pixel units 1 on the camera area 1012 to form the light transmission hole 2 is conducive to external light being able to be directly incident on the camera component 200 disposed below the display panel 100 corresponding to the camera area 1012 in a later stage through the light transmission hole 2, thereby achieving the purpose of photography. Because a part on the pixel units 1 on the camera area 1012 are removed, the pixel units 1 not removed on the display panel 100 of the camera area 1012 can still display normally. Therefore, at the time solving the problem of transmissive ability of the camera component 200, a full screen can be realized to increase the screen-to-body ratio of the display panel 100.

As illustrated in FIG. 2 and FIG. 3, a distribution density of the pixel units 1 on the camera area 1012 is less than a distribution density of the pixel units on the main display area 1011. Specifically, the distribution density of the pixel units 1 on the camera area 1012 is less than or equal to half of the distribution density of the pixel units 1 on the main display area 1011. In other words, one light transmission hole 2 can be disposed on the camera area 1012 by skipping one of the pixel units 1.

Furthermore, the pixel units 1 on the main display area 1011 are arranged uniformly. This is mainly for preventing display difference incurred by uneven distribution of the pixel units 1 to avoid causing poor experience to clients.

Furthermore, the pixel units 1 on the camera area 1012 are arranged uniformly. This is mainly for preventing display difference incurred by uneven distribution of the pixel units 1 to avoid poor experiences to clients. On the other hand, because removing part of the pixel units 1 on the camera area 1012 to form the light transmission hole will lead a number of pixel units in an unit area to be decreased, when the clients are using, they will perceive the difference between the pixel units 1 being removed and the pixel units 1 being not removed. Therefore, arranging the pixel units uniformly as far as possible can make the display panel 100 of the camera area 1012 to display more evenly.

As illustrated in FIG. 1, in order to take pictures by the plurality of camera components 200 together, to correct the picture quality to optimize the photos, and to increase a photographing range of camera, a number of the camera components 200 needs to be increased, so a number of the camera area 1012 needs to be increased. Therefore, the display region 101 can include two or three camera areas 1012, and each of the camera areas 1012 has at least one light transmission hole 2. The display region 101 of this embodiment includes two camera areas 1012.

As illustrated in FIG. 1, because the formation of the light transmission hole 2 leads to reduction of the number of the pixel units 1 in an unit area, resulting in decrease of screen display fineness. When the clients are using, they will perceive the difference between the pixel units 1 being removed and the pixel units 1 being not removed, so their experiences are affected. Since the clients focus on the center and pay less attention to the corners during use, the camera areas 1012 are disposed on an upper left corner and an upper right corner of the display panel 100, so as to prevent the clients from perceiving a sense of picture difference from the configuration of the light transmission hole 2.

As illustrated in FIG. 1, a shape of the camera area 1012 includes one or more of a rectangular shape, a polygonal shape, a circular shape, and an ellipse. The shape of the camera area 1012 in this embodiment is a rectangular shape.

Figure 4:
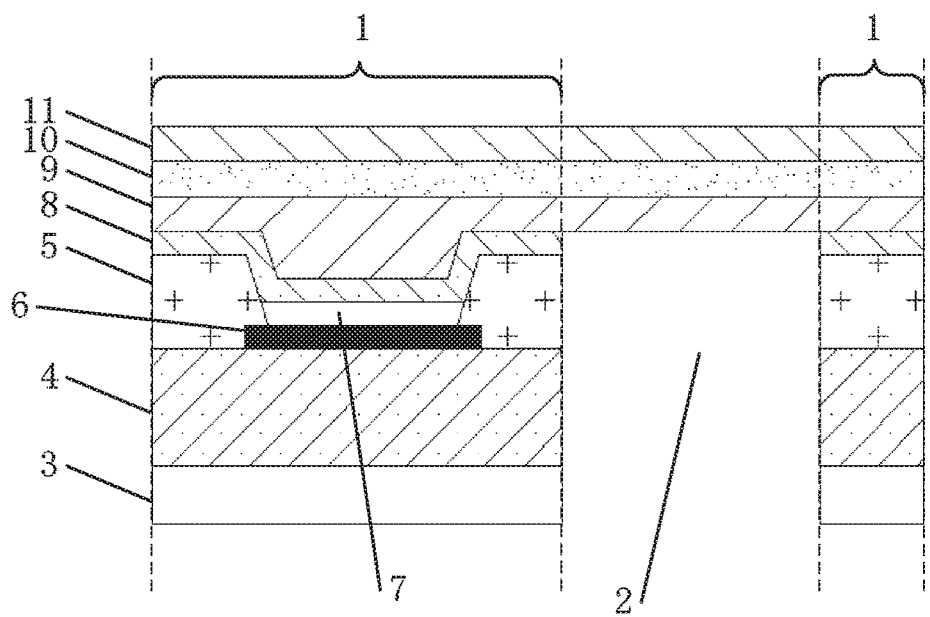
FIG. 4 is a structural schematic diagram of the display panel on the camera area of the present disclosure.

As illustrated in FIG. 4, the pixel units include a substrate 3, a thin film transistor structure layer 4, a pixel definition layer 5, a pixel electrode 6, a light emitting layer 7, and a cathode layer 8. Furthermore, the thin film transistor structure layer 4 is disposed on the substrate 3. The pixel definition layer 5 is disposed on the thin film transistor structure layer 4, and the pixel definition layer 5 has an opening. The pixel electrode 6 is disposed in the opening of the pixel definition layer 5. The light emitting layer 7 is disposed on the pixel electrode 6 in the opening. The cathode layer 8 is disposed on the light emitting layer 7.

When an electric power is supplied to an appropriate voltage, electron holes in the pixel electrode 6 and electrons in the cathode layer 8 are combined in the light emitting layer 7, and under Coulomb force, excitons (electron-hole pairs) in an excited state are combined at a certain probability, and the excited state is unstable in a general environment. The excitons in the excited state recombine and transfer energy to a luminescent material in the light emitting layer 7, causing it to jump from a ground state to the excited state, and energy in the excited state generates photons through a radiation relaxation process to release light energy and generate light.

Furthermore, the thin film transistor structure layer 4 includes structures such as a buffer layer, an active layer, a gate electrode layer, a gate insulating layer, a source/drain electrode layer, an interlayer insulation layer, a planarization layer, etc., and redundant description will not be mentioned herein.

As illustrated in FIG. 4, the transmission hole 2 penetrates from a surface of the cathode layer 8 away from the substrate 3 to a surface of the substrate 3 away from the cathode layer 8. Actually, the light transmission hole 2 can further penetrates from a surface of the pixel electrode 6 away from the substrate 3 to the surface of the substrate 3 away from the cathode layer 8. The design of this embodiment can prevent light from entering into the camera component 200 incurred by the configuration of the light emitting layer 7 and the cathode layer 8 and can improve light transmissive effect, and on the other hand, it can also prevent material waste of the light emitting layer 7 and the cathode layer 8 to lower production cost.

Figure 5:
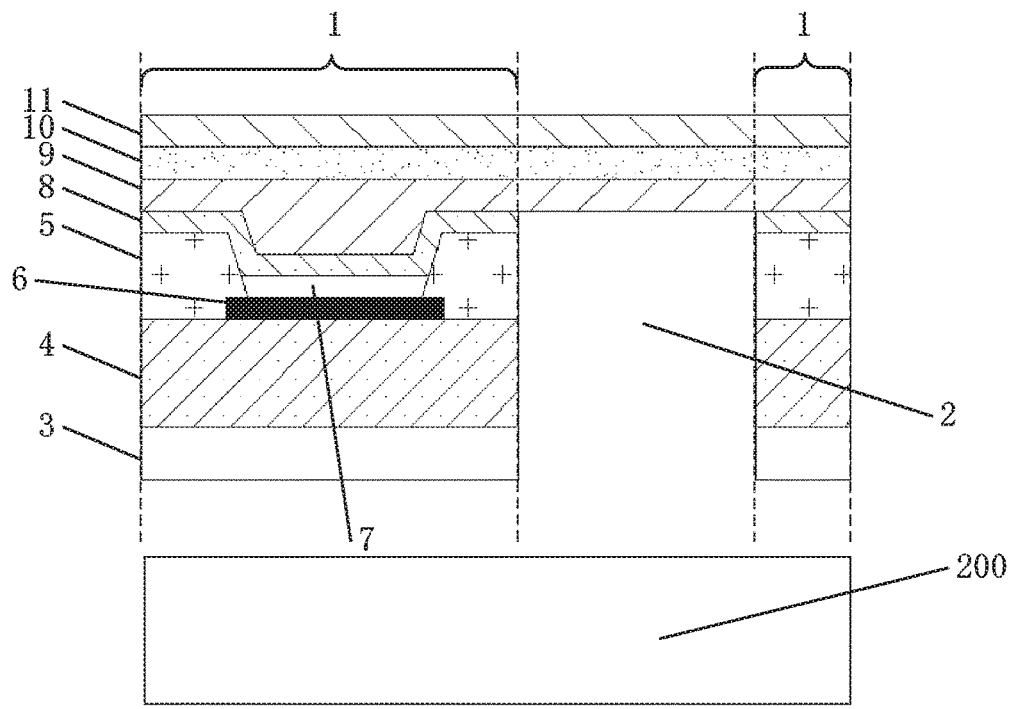
FIG. 5 is a structural schematic diagram of a display device on the camera area of the present disclosure.

As illustrated in FIG. 5, the display panel 100 further includes a first inorganic layer 9, an organic layer 10, and a second inorganic layer 11. Furthermore, the first inorganic layer 9 is disposed on the cathode layer 8. The organic layer 10 is disposed on the first inorganic layer 9. The second inorganic layer 11 is disposed on the organic layer 10.

The first inorganic layer 9 and the second inorganic layer 11 are mainly for effect of blocking water/oxygen to prevent intrusion of water/oxygen from causing corruption of the components in the display panel 100 to improve service life of products.

Furthermore, the organic layer 10 is mainly used for buffer effect to achieve stress release effect during using the display device to prevent the display device from corruption during external stress is applied.

As illustrated in FIG. 5, the present disclosure further provides a display device, which includes the display panel 100 relating to the present disclosure and further includes a camera component 200 correspondingly disposed below the display panel 100 of the camera area 1012.

The present disclosure further provides a mobile terminal, and the mobile terminal includes the display device mentioned above. Furthermore, the mobile terminal includes one or more of a tablet PC and a laptop. Furthermore, the mobile terminals generally have icons for displaying energy, for displaying network signals, and for displaying time, and common clients rarely notice these icons during using them. Therefore, we can make the camera areas 1012 dispose on positions corresponding to these icons, and as the same, this can prevent the clients from perceiving the sense of picture difference from the configuration of the light transmission hole 2.

Second Embodiment

Figure 6:
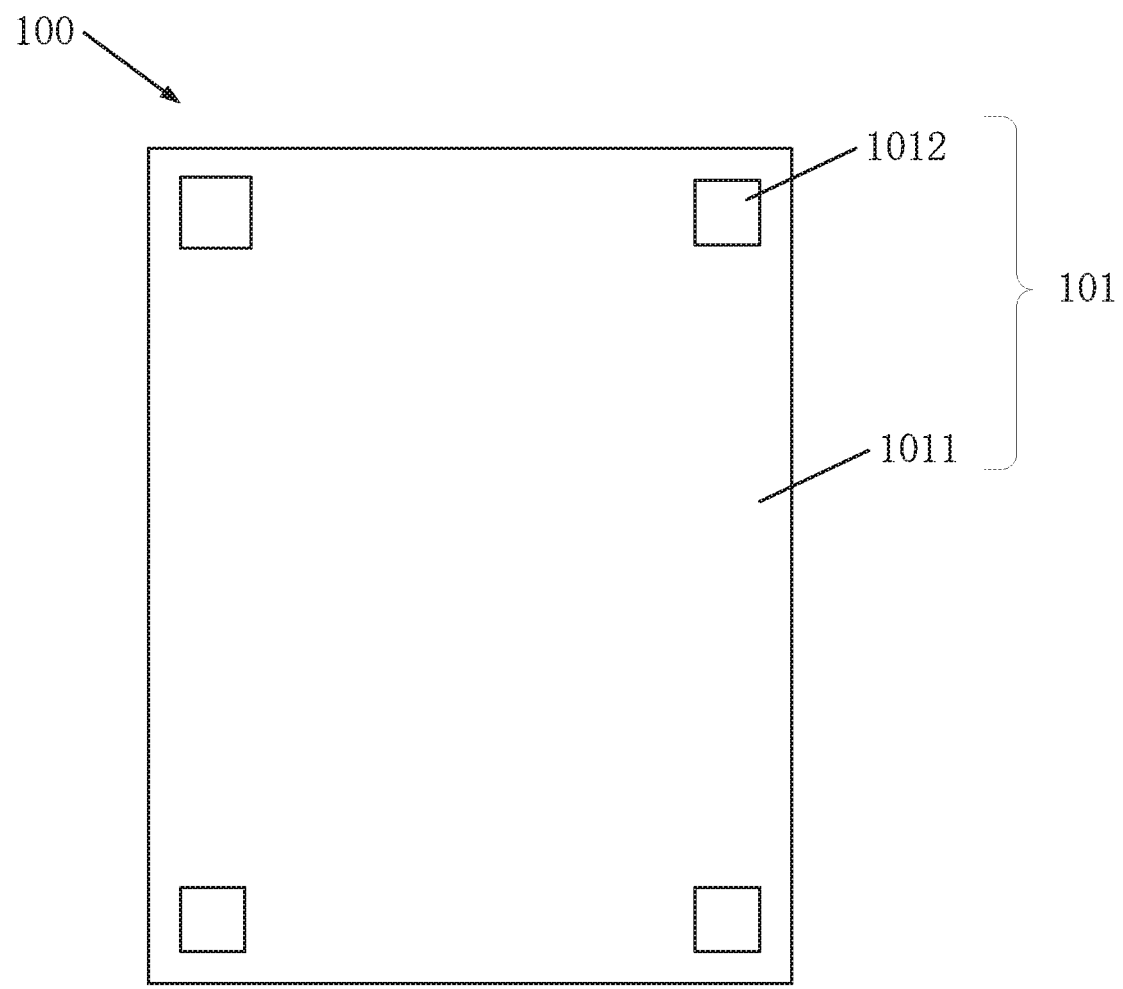
FIG. 6 is a plane schematic diagram of the display panel of a second embodiment of the present disclosure.

As illustrated in FIG. 6, a difference between this embodiment and the first embodiment is that the display region 101 includes four camera areas 1012, and each of the camera areas 1012 have at least one light transmission hole 2. The camera areas 1012 are disposed on four corners of the display panel 100, so as to prevent the clients from perceiving a sense of picture difference from the configuration of the light transmission hole 2.

The display panel and the display device thereof provided by the present disclosure are described in detail above. It should be understood that the exemplary embodiments described herein should be considered in descriptive, and is used for understanding the method of the present disclosure and its main idea, and is not intended to limit the present disclosure. Descriptions of features or aspects in each exemplary embodiment should generally be considered as being applied to similar features or aspects in other exemplary embodiments. While the present disclosure has been described with reference to the preferred embodiments, various modifications and changes can be made by those skilled in the art. The present disclosure is intended to cover such varieties and modifications within the scope of the appended claims, and any modifications, equivalents, and improvements made within the spirit and scope of the present disclosure should be included in the scope of the present disclosure.

What is claimed is:

1. A display panel, comprising:
   a display region comprising a main display area and at least one camera area;
   a plurality of pixel units distributed on the display panel of the display region;
   wherein a distribution density of the pixel units on the camera area is less than a distribution density of the pixel units on the main display area; and
   at least one light transmission hole defined on an area of the camera area without the plurality of pixel units.

2. The display panel as claimed in claim 1, wherein the plurality of pixel units on the main display area and the camera area are arranged uniformly.

3. The display panel as claimed in claim 2, wherein the distribution density of the pixel units on the camera area is less than or equal to half of the distribution density of the pixel units on the main display area.

4. The display panel as claimed in claim 1, wherein the display region comprises two, three, or four camera areas, and each of the camera areas has the at least one light transmission hole.

5. The display panel as claimed in claim 1, wherein the plurality of pixel units comprises:
a substrate;
a thin film transistor structure layer disposed on the structure;
a pixel definition layer disposed on the thin film transistor structure layer, wherein the pixel definition layer comprises an opening;
a pixel electrode disposed in the opening of the pixel definition layer;
a light emitting layer disposed on the pixel electrode in the opening; and
a cathode layer disposed on the light emitting layer.

6. The display panel as claimed in claim 5, wherein the at least one light transmission hole penetrates from a surface of the cathode layer away from the substrate to a surface of the substrate away from the cathode layer.

7. The display panel as claimed in claim 1, wherein the plurality of pixel units comprise four subpixels, and the subpixel are respectively a red subpixel, a blue subpixel, and two green subpixels.

8. The display panel as claimed in claim 1, wherein a shape of the camera area comprises one or more of a rectangular shape, a polygonal shape, a circular shape, and an ellipse.

9. The display panel as claimed in claim 5, wherein the display panel comprises:
a first inorganic layer disposed on the cathode layer;
an organic layer disposed on the first inorganic layer; and
a second inorganic layer disposed on the organic layer.

10. A display device, comprising the display panel as claimed in claim 1, and comprising a camera component correspondingly disposed below the display panel of the camera area, wherein the display panel comprises:
a display region comprising a main display area and at least one camera area;
a plurality of pixel units distributed on the display panel of the display region;
wherein a distribution density of the pixel units on the camera area is less than a distribution density of the pixel units on the main display area; and
at least one light transmission hole defined on an area of the camera area without the plurality of pixel units.

11. The display device as claimed in claim 10, wherein the plurality of pixel units on the main display area and the camera area are arranged uniformly.

12. The display device as claimed in claim 11, wherein the distribution density of the pixel units on the camera area is less than or equal to half of the distribution density of the pixel units on the main display area.

13. The display device as claimed in claim 10, wherein the display region comprises two, three, or four camera areas, and each of the camera areas has the at least one light transmission hole.

14. The display device as claimed in claim 10, wherein the plurality of pixel units comprises:
a substrate;
a thin film transistor structure layer disposed on the structure;
a pixel definition layer disposed on the thin film transistor structure layer, wherein the pixel definition layer comprises an opening;
a pixel electrode disposed in the opening of the pixel definition layer;
a light emitting layer disposed on the pixel electrode in the opening; and
a cathode layer disposed on the light emitting layer.

15. The display device as claimed in claim 14, wherein the at least one light transmission hole penetrates from a surface of the cathode layer away from the substrate to a surface of the substrate away from the cathode layer.

16. The display device as claimed in claim 10, wherein the plurality of pixel units comprise four subpixels, and the subpixel are respectively a red subpixel, a blue subpixel, and two green subpixels.

17. The display device as claimed in claim 10, wherein a shape of the camera area comprises one or more of a rectangular shape, a polygonal shape, a circular shape, and an ellipse.

18. The display device as claimed in claim 14, wherein the display device comprises:
a first inorganic layer disposed on the cathode layer;
an organic layer disposed on the first inorganic layer; and
a second inorganic layer disposed on the organic layer.

* * * * *

UNITED STATES PATENT AND TRADEMARK OFFICE
CERTIFICATE OF CORRECTION

PATENT NO. : 11,335,754 B2
APPLICATION NO. : 16/769592
DATED : May 17, 2022
INVENTOR(S) : Zhenmin Wang It is certified that error appears in the above-identified patent and that said Letters Patent is hereby corrected as shown below:

On the Title Page

In item (73) Assignee:
"Wuhan China Star Optoelectronies Semiconductor Display Technology Co., Ltd."
Should be changed to:
-- Wuhan China Star Optoelectronics Semiconductor Display Technology Co., Ltd. --

Signed and Sealed this
Twentieth Day of December, 2022

Katherine Kelly Vidal
*Director of the United States Patent and Trademark Office*